United States Patent
Lin et al.

(10) Patent No.: US 10,134,770 B2
(45) Date of Patent: Nov. 20, 2018

(54) PREPARATION METHOD OF CONDUCTIVE VIA HOLE STRUCTURE, ARRAY SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Zhiyuan Lin, Beijing (CN); Yinhu Huang, Beijing (CN); Zhixiang Zou, Beijing (CN); Binbin Cao, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 126 days.

(21) Appl. No.: 15/114,219

(22) PCT Filed: Jan. 21, 2016

(86) PCT No.: PCT/CN2016/071615
§ 371 (c)(1),
(2) Date: Jul. 26, 2016

(87) PCT Pub. No.: WO2017/008493
PCT Pub. Date: Jan. 19, 2017

(65) Prior Publication Data
US 2017/0148819 A1    May 25, 2017

(30) Foreign Application Priority Data

Jul. 13, 2015 (CN) .......................... 2015 1 0415374

(51) Int. Cl.
*H01L 27/12* (2006.01)
*H01L 21/77* (2017.01)
(Continued)

(52) U.S. Cl.
CPC .......... *H01L 27/124* (2013.01); *G02F 1/1368* (2013.01); *G02F 1/13439* (2013.01);
(Continued)

(58) Field of Classification Search
CPC .................................................... H01L 27/124
See application file for complete search history.

(56) References Cited

U.S. PATENT DOCUMENTS 8,624,290 B2    1/2014  Hirai
2014/0138717 A1*    5/2014  Kong ................ G02F 1/133555
                                                           257/88

(Continued)

FOREIGN PATENT DOCUMENTS

CN    101740726 A    6/2010
CN    101752403 A    6/2010
(Continued)

OTHER PUBLICATIONS

Chinese Office Action in Chinese Application No. 201510415374.4, dated Jul. 3, 2017 with English translation.
(Continued)

*Primary Examiner* — Errol Fernandes
(74) *Attorney, Agent, or Firm* — Collard & Roe, P.C.

(57) ABSTRACT

A preparation method of a conductive via hole structure, a preparation method of an array substrate and a preparation method of a display device, the preparation method of the array substrate includes: forming a first metal layer (01) including the first metal structure (01a), forming a non-metallic film including a first part corresponding to the first metal structure (01a) and an organic insulating film (40') in (Continued)

sequence; patterning the organic insulating film (40') to form a first organic insulating layer via hole (41) corresponding to the first part; then baking to form an organic insulating layer (40); and then, removing the first part of the non-metallic film to form a non-metallic layer and expose the part of the surface (011) of the first metal structure (01*a*). This method can avoid the metal structure from being seriously oxidized.

13 Claims, 10 Drawing Sheets

(51) Int. Cl.

| | | |
|---|---|---|
| *G02F 1/1333* | (2006.01) | |
| *G02F 1/1343* | (2006.01) | |
| *G02F 1/1362* | (2006.01) | |
| *G02F 1/1368* | (2006.01) | |
| *H01L 21/308* | (2006.01) | |
| *H01L 21/768* | (2006.01) | |
| *H01L 29/45* | (2006.01) | |
| *H01L 29/49* | (2006.01) | |
| *G02F 1/136* | (2006.01) | |

(52) U.S. Cl.
CPC .. *G02F 1/133345* (2013.01); *G02F 1/134309* (2013.01); *G02F 1/136227* (2013.01); *G02F 1/136286* (2013.01); *H01L 21/3081* (2013.01); *H01L 21/3086* (2013.01); *H01L 21/76802* (2013.01); *H01L 21/77* (2013.01); *H01L 27/1262* (2013.01); *H01L 29/45* (2013.01); *H01L 29/4908* (2013.01); *G02F 2001/13606* (2013.01); *G02F 2001/13629* (2013.01); *G02F 2001/136222* (2013.01); *G02F 2001/136295* (2013.01); *G02F 2201/121* (2013.01); *G02F 2201/123* (2013.01)

(56) References Cited

U.S. PATENT DOCUMENTS

| | | |
|---|---|---|
| 2014/0339539 A1 | 11/2014 | Yamazaki et al. |
| 2015/0370109 A1 | 12/2015 | Cao et al. |
| 2016/0260750 A1* | 9/2016 | Ueda ............... H01L 27/101 |

FOREIGN PATENT DOCUMENTS

| | | |
|---|---|---|
| CN | 101800286 A | 8/2010 |
| CN | 102800630 A | 11/2012 |
| CN | 104681626 A | 6/2015 |
| CN | 104992925 A | 10/2015 |

OTHER PUBLICATIONS

International Search Report of PCT/CN2016/071615 in Chinese, dated Apr. 27, 2016 with English translation.

Notice of the Transmittal of the International Search Report of PCT/CN2016/071615 in Chinese, dated Apr. 27, 2016.

Written Opinion of the International Searching Authority of PCT/CN2016/071615 in Chinese, dated Apr. 27, 2016 with English translation.

Second Chinese Office Action in CN 201510415374.4, dated Feb. 9, 2018.

* cited by examiner

PREPARATION METHOD OF CONDUCTIVE VIA HOLE STRUCTURE, ARRAY SUBSTRATE AND DISPLAY DEVICE

CROSS REFERENCE TO RELATED APPLICATIONS

This application is the National Stage of PCT/CN2016/071615 filed on Jan. 21, 2016, which claims priority under 35 U.S.C. § 119 of Chinese Application No. 201510415374.4 filed on Jul. 13, 2015, the disclosure of which is incorporated by reference.

TECHNICAL FIELD

At least one embodiment of the present disclosure relates to a preparation method of a conductive via hole structure, an array substrate and a display device.

BACKGROUND

In the display technique field, along with the increased requirements on such display performance as the size enlargement of display devices and the improvement of refresh rate, the requirement on the resistance of the structures such as gate lines and data lines in metal layers is also increased accordingly. Currently, due to high resistivity, aluminum wires which are mainly used at present can not meet the requirements of display performance. While the resistivity of copper is 30% lower than the resistivity of aluminum, therefore, it becomes a common selection that the structures such as gate lines and data lines in metal layers are made from copper.

In liquid crystal display devices, for instance, in a liquid crystal display device of ADS (Advanced Super Dimension Switch) mode, parasitic capacitance is generated between a common electrode and a metal layer (for example, a gate metal layer or a source/drain layer) which are disposed on an array substrate. This results in an excessive power consumption of the display device. Forming of a thick organic insulating layer (for example, a resin layer) between the common electrode and the metal layer can reduce the capacitance of the circuits, thus, the power consumption is reduced. This configuration has been widely applied to products so far.

The combination of a copper metal layer and an organic insulating layer can be applied to reduce the resistance and the capacitance, thus significantly reducing impedance and power consumption and improving the performance of a product.

SUMMARY

At least one embodiment of the present disclosure provides a preparation method of a conductive via hole structure, a preparation method of an array substrate array substrate and a preparation method of a display device, in the premise of minimizing cost, to avoid the poor contact between a metal structure and other component caused by the metal structure on the array substrate that is seriously oxidized after the organic insulating layer is formed.

At least one embodiment of the present disclosure provides a preparation method of an array substrate, the method comprises: forming a first metal layer comprising a first metal structure; forming a non-metallic film on the first metal layer, the non-metallic film comprising a first part corresponding to the first metal structure; forming an organic insulating film on the non-metallic film, and patterning the organic insulating film to form a first organic insulating layer via hole corresponding to the first part; baking the organic insulating film that has been patterned to form an organic insulating layer; and after the organic insulating layer is formed, removing the first part of the non-metallic film to form a non-metallic layer and expose a part of a surface of the first metal structure.

At least one embodiment of the present disclosure provides a preparation method of an array substrate, the method comprises: forming an insulating film; forming an organic insulating film on the insulating film, and patterning the organic insulating film to form a plurality of organic insulating layer via holes, an orthographic projection on the plane, where the insulating film is disposed, of the plurality of organic insulating layer via holes overlapping with the insulating film; baking the organic insulating film that has been patterned to form an organic insulating layer; and etching the insulating film with the organic insulating layer as a mask, to form an insulating layer and a plurality of insulating layer via holes in the insulating layer.

At least one embodiment of the present disclosure provides a preparation method of a display device, the display device comprises an array substrate, and the method comprises: preparing the array substrate using the preparation method mentioned above.

At least one embodiment of the present disclosure provides a preparation method of a conductive via hole structure, and the method comprises: forming a metal layer, the metal layer comprises a metal structure; forming a non-metallic film on the metal layer, the non-metallic film comprising a part corresponding to the metal structure; forming an organic insulating film on the non-metallic film, and patterning the organic insulating film to form an organic insulating layer via hole, the organic insulating layer via hole corresponds to the part of the non-metallic film; baking the organic insulating film that has been patterned to form an organic insulating layer; and after the organic insulating layer is formed, removing the part of the non-metallic film to form a non-metallic layer and expose a part of a surface of the metal structure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
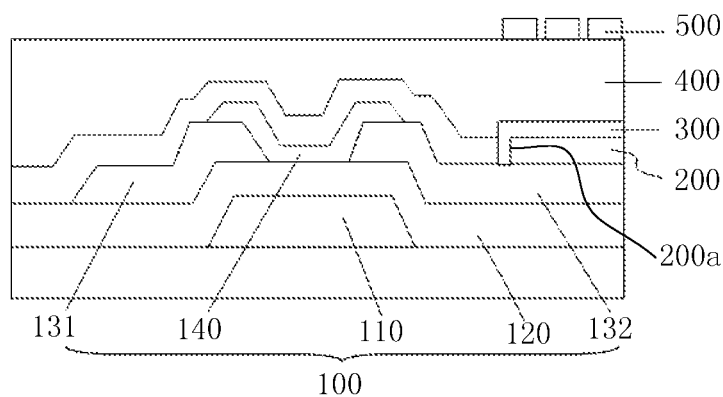
FIG. 1 is a cross-section schematic view of a part of an array substrate.

FIG. 1 is a cross-section schematic view of a part of an array substrate in ADS mode. As illustrated in FIG. 1, a thin film transistor 100, a passivation layer 200, a pixel electrode 300, an organic insulating layer 400 and a common electrode 500 are sequentially disposed on the array substrate. For example, a bottom gate structure can be applied to the thin film transistor that comprises a gate electrode 110, a gate insulating layer 120, a source electrode 131, a drain electrode 132, and an active layer 140 contacting the source electrode 131 and the drain electrode 132.

For example, the fabricating process of the array substrate as illustrated in FIG. 1 comprises the following step 1 to step 8 which will be described in detail as follows.

Step 1: forming a gate metal film, and patterning the gate metal film to form a gate metal layer which comprises a gate electrode 110, a common electrode line and a plurality of gate lines (the common electrode line and the gate lines are not illustrated in FIG. 1).

Step 2: forming a gate insulating film covering the gate electrode 110, the common electrode line and the gate lines which are formed in step 1.

Step 3: forming a source/drain metal film on the gate insulating film, and patterning the source/drain metal film to form a source/drain metal layer comprising a source electrode 131, a drain electrode 132, and a plurality of data lines (not illustrated in FIG. 1).

Step 4: forming an active layer film, and patterning the active layer film to form an active layer 140 that contacts the source electrode 131 and the drain electrode 132.

Step 5: forming a passivation film on the active layer 140, and patterning the passivation film to form a passivation layer 200, the gate insulating layer 120, a plurality of passivation layer via holes in the passivation layer 200, and a plurality of via holes passing through the passivation layer 200 and the gate insulating layer 120.

For example, the plurality of passivation layer via holes in the passivation layer 200 comprises: a first passivation layer via hole 200a exposing part of a surface of the drain electrode 132 for connecting the drain electrode 132 and a pixel electrode that will be formed subsequently, and a second passivation layer via hole (not illustrated in FIG. 1) exposing part of a surface of the data line for connecting the data line and a source driving circuit (not illustrated in FIG. 1) of the source electrode.

For example, the plurality of via holes (not illustrated in FIG. 1) passing through the passivation layer 200 and the gate insulating layer 120 comprises: the via hole exposing part of a surface of the gate line and for connecting the gate line and a gate driving circuit (not illustrated in FIG. 1), and the via hole exposing part of a surface of the common electrode line and for connecting the common electrode line and the common electrode that will be formed subsequently.

Step 6: forming a pixel electrode 300 on the passivation layer 200, in which the pixel electrode 300 and the drain electrode 132 are connected through the first passivation layer via hole 200*a* that is formed in step 5.

Step 7: forming an organic insulating layer 400. For example, forming the organic insulating layer 400 comprises: forming an organic insulating film; then, patterning the organic insulating film to form a plurality of organic insulating layer via holes; next, baking the organic insulating film which has been patterned. For example, the baking temperature is greater than or equal to 200 □ to form the organic insulating layer 400.

In this step, the organic insulating layer via holes can comprise via holes correspondingly communicating with the first and second passivation layer via holes and with the via holes passing through the passivation layer 200 and the gate insulating layer 120 formed in step 5 respectively.

Step 8: forming a common electrode 500 on the organic insulating layer 400. The common electrode 500 and the common electrode line are connected through the via hole formed in step 5 exposing part of the surface of the common electrode line and the corresponding via hole formed in step 7.

In research, the inventors of the present disclosure noted that because the organic insulating layer 400 need to be baked in the fabricating process (for example, the baking temperature is greater than or equal to 200° C.), and copper is easy to be oxidized, for the metal structure (for example, the structure in the gate metal layer and/or the source/drain metal layer) which is made from copper and part of the surface of which is exposed before the organic insulating layer 400 is formed, the exposed part of the surface of the metal structure is seriously oxidized after the organic insulating layer 400 is formed. This may cause that the metal structure is in poor contact with another component at this part of the surface.

Figure 2A:
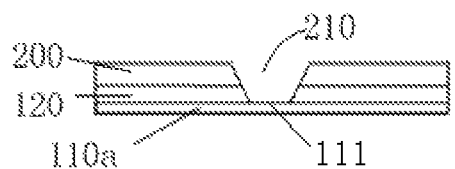
FIG. 2a is a cross-section schematic view of the array substrate as illustrated in FIG. 1 at a common electrode line before an organic insulating layer is formed.
Figure 2B:
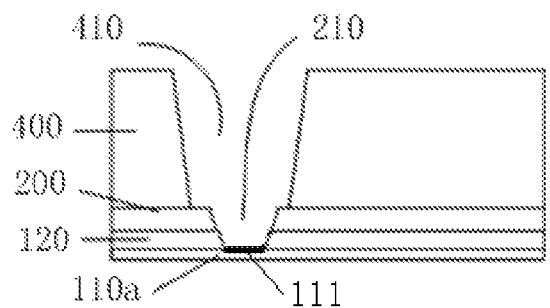
FIG. 2b is a cross-section schematic view of the array substrate as illustrated in FIG. 1 at a common electrode line after the organic insulating layer is formed.

For example, as illustrated in FIG. 2*a* and FIG. 2*b*, before forming the organic insulating layer 400, the via hole 210 passing through the gate insulating layer 120 and the passivation layer 200 exposes part of the surface 111 of the common electrode line 110*a*; after the organic insulating layer 400 is formed, the part of the surface 111 of the common electrode line 110*a* is seriously oxidized. This may cause that the common electrode 500 is in poor contact with the common electrode line 110*a*.

Embodiments of the present disclosure provide a preparation method of a conductive via hole structure, a preparation method of an array substrate and a preparation method of a display device. In embodiments of the present disclosure, before forming the organic insulating layer on the metal structure, part of the surface of the metal structure is covered by a non-metallic layer, and the part of the non-metallic layer covering the part of the surface is removed after the organic insulating layer is formed. This can protect the metal structure from being seriously oxidized after the organic insulating layer is formed in the premise of minimizing costs.

Figure 3:
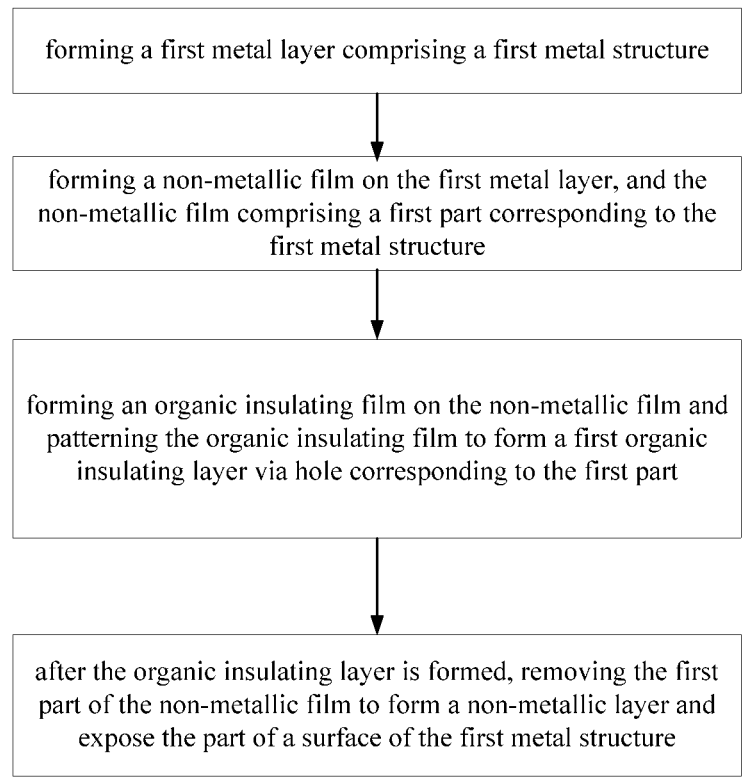
FIG. 3 is a flow chart of a method of fabricating an array substrate according to an embodiment of the present disclosure.

As illustrated in FIG. 3, the preparation method of an array substrate according to at least one embodiment of the present disclosure comprises: forming a first metal layer comprising a first metal structure; forming a non-metallic film on the first metal layer, wherein the non-metallic film comprises a first part corresponding to the first metal structure; forming an organic insulating film on the non-metallic film and patterning the organic insulating film to form a first organic insulating layer via hole corresponding to the first part; baking the organic insulating film that has been patterned to form an organic insulating layer; and after the organic insulating layer is formed, removing the first part of the non-metallic film to form a non-metallic layer and expose the part of a surface of the first metal structure. This method can avoid the metal structure from being seriously oxidized after the organic insulating layer is formed in the premise of minimizing costs.

In embodiments of the present disclosure, the operation of forming the non-metallic layer comprises: etching the first part of the non-metallic film with the organic insulating layer as a mask. This can save the usage of a mask.

The preparation method as illustrated in FIG. 3 is described in combination with embodiments 1 to 3 as follows.

First Embodiment

An embodiment of the present disclosure provides a preparation method of an array substrate. In the preparation method, the non-metallic film on the first metal layer comprises a first insulating film, and the non-metallic layer comprises the first insulating layer and a first via hole in the first insulating layer. The first via hole exposing part of the surface of the first metal structure.

Figure 4A:
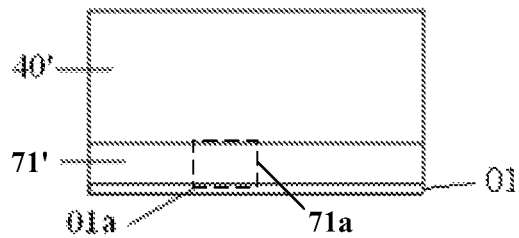
FIG. 4a to FIG. 4c are schematic views of an array substrate that is fabricated by using a method according to an embodiment of the present disclosure in the steps of fabricating a first metal layer, a first insulating layer and an organic insulating layer.
Figure 4B:
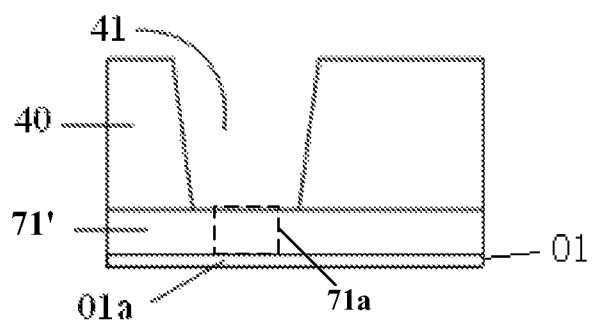
Figure 4C:
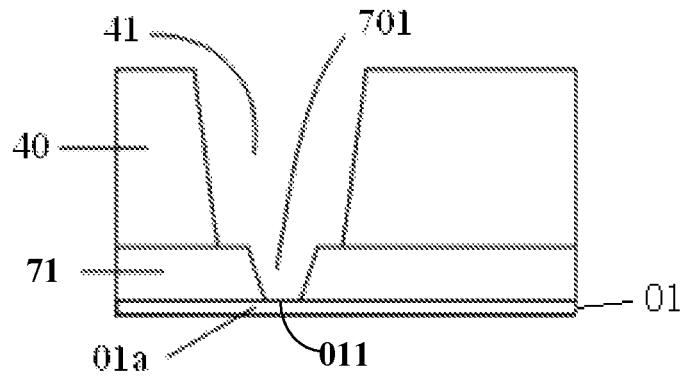

As illustrated in FIG. 4*a* to FIG. 4*c*, the preparation method of the array substrate comprises the following steps S11 to S14 which will be described in detail as follows.

Step S11: as illustrated in FIG. 4*a*, forming a first metal layer 01 comprising a first metal structure 01*a*.

The first metal layer 01 can be formed in a conventional way in the related art, which is not repeated herein.

Step S12: as illustrated in FIG. 4*a*, forming a first insulating film 71' on the first metal layer 01. The first insulating film 71' comprises a first part 71*a* corresponding to the first metal structure 01*a* (i.e., the orthographic projection of the first part 71*a* on the plane where the first metal structure 01*a* is disposed overlaps with the first metal structure 01*a*).

It should be noted that, in this embodiment and the following embodiments, a structure A corresponding to a structure B means: the orthographic projection of the structure A on the plane where the structure B is disposed overlaps with the structure B.

Step S13: as illustrated in FIG. 4*a*, forming an organic insulating film 40' on the first insulating film 71'; patterning the organic insulating film 40' to form a first organic insulating layer via hole 41. As illustrated in FIG. 4*b*, the first organic insulating layer via hole 41 corresponds to the first part 71*a* of the first insulating film 71' (i.e., corresponding to the first metal structure 01*a*). Then the organic insulating film 40' that has been patterned is baked to form an organic insulating layer 40.

In this step, before the process of baking, the first organic insulating layer via hole 41 corresponds to the first part of the first insulating film 71', that is, in the patterning process of the organic insulating film 40', the first part 71*a* of the first insulating film 71' should be kept to avoid exposing the first metal structure 01*a*.

For example, the baking temperature is greater than or equal to 200° C. It should be noted that, this baking temperature range is a conventional temperature range in the related art, and it is only to illustrate the baking process and not limitative to the scope of the embodiment.

It should be noted that, the patterning process in this embodiment can be any process that can process a film to form a predetermined pattern. For example, it can be a process that forms a predetermined pattern by using a mask.

Step S14: as illustrated in FIG. 4c, after the organic insulating layer 40 is formed, removing the first part 71a of the first insulating film 71', to form a first insulating layer 71 and a first via hole 701 in the first insulating layer 71 exposing the part of the surface 011 of the first metal structure 01a.

In this step, for example, the first insulating film 71' can be patterned in via hole process by using a mask (that is, forming a via hole in the insulating layer) to remove the first part 71a of the first insulating film 71', and thus to form the first insulating layer 71 and the first via hole 701.

For example, the first part 71a of the first insulating film 71' can be etched (for example, dry etched) with the organic insulating layer 40 as a mask, to form the first insulating layer 71 and the first via hole 701. Using the organic insulating layer 40 as a mask can save a mask for patterning the first insulating film in the via hole process, and thus the cost is reduced.

In this example, using the organic insulating layer 40 as a mask may cause slight deformation to the organic insulating layer 40. Therefore, after the first insulating layer 71 and the first via hole 701 are formed, the organic insulating layer 40 can be, for instance, ashed.

In the preparation method of an array substrate according to this embodiment, the process of forming the via hole in the first insulating film between the first metal structure and the organic insulating layer is adjusted to be performed after the organic insulating layer is formed. Thus, in the process of baking to form the organic insulating layer, the first metal structure is protected by the first insulating film, and the poor contact of the first metal structure with another component caused by the serious oxidization of the metal structure is avoided. Further, compared with the preparation method of an array substrate as illustrated in FIG. 1, in this embodiment, only the sequence of the via hole process in the non-metallic layer (for example, the first insulating layer) that is disposed between the first metal structure and the organic insulating layer is changed, and no extra process is introduced. Thus, the fabricating cost is not increased. In addition, in at least one example of this embodiment, using the organic insulating layer as a mask can save a mask used in the via hole process of the non-metallic film (for example, the first insulating film). Thus, the cost is reduced.

This embodiment is suitable for the first metal structure that is made from copper or a copper alloy. That is, the first metal structure 01a is made from a material comprising copper or a copper alloy. Because compared with other metal materials such as aluminium and molybdenum, copper is more prone to be seriously oxidized at a high temperature, and it is more easy to cause the poor contact of the first metal structure with other components. Of course, the first metal structure 01a not only can be made from copper or a copper alloy, but also can be made from another metal that may be seriously oxidized to bring about the poor contact at the location after the organic insulating layer 40 is formed.

Because the main function of the organic insulating layer 40 is to increase the distance between the common electrode layer and the metal layer under the common electrode layer, so as to reduce the parasitic capacitance between the common electrode in the common electrode layer and the metal structure in the metal layer, and thus reduce the power consumption. Therefore, the organic insulating layer 40 is thicker than other insulating layer(s) that is between the common electrode and the metal layer and under the organic insulating layer 40. For example, the thickness of the organic insulating layer 40 can be in the range from 10000 angstrom to 40000 angstrom. Usually, the thickness of the inorganic insulating layer (for example, inorganic insulating layer such as silicon dioxide layer or silicon nitride layer) in the array substrate is about 4000 angstrom; for example, the thickness of the gate insulating layer can be less than 4000 angstrom; for example, the thickness of the passivation layer can be in the range from 2500 angstrom to 4000 angstrom. It can be seen that, the thickness of the organic insulating layer 40 is larger than the thickness of the inorganic insulating layer.

In at least one example, the organic insulating layer 40 can be made from a material comprising a resin (for example, acrylic, or photoresist). The organic insulating layer 40 that is made from any of these organic materials not only can meet the thickness requirement to minimize power consumption, but also can ensure light transmittance.

In at least one example, the COA (Color filter On Array) technology can be applied in the array substrate, i.e., a layer of color filter is disposed on the array substrate. In this configuration, the organic insulating layer 40 can be the layer of color filter.

Figure 5:
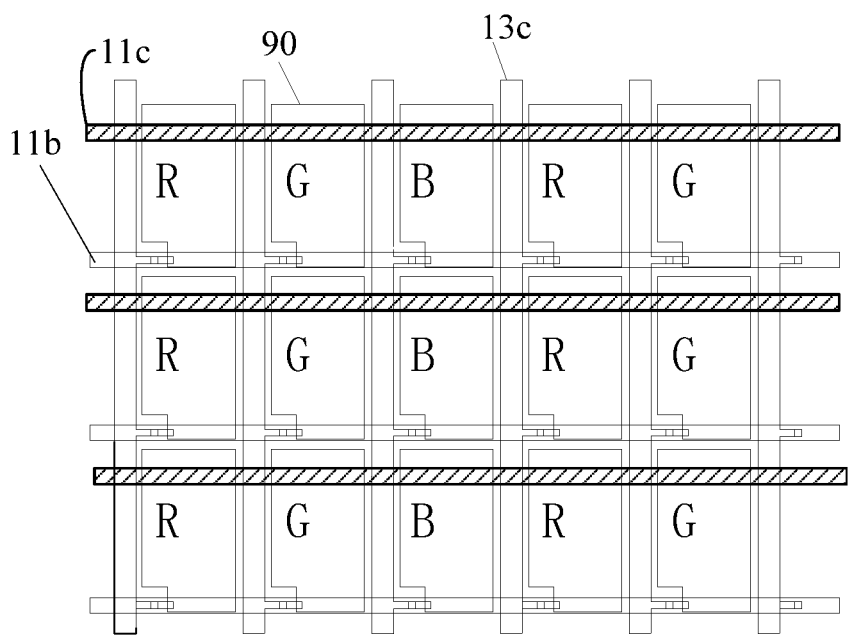
FIG. 5 is a top schematic view of an array substrate that can be fabricated by using a method according to an embodiment of the present disclosure.

For example, as illustrated in FIG. 5, the color filter layer 90 comprises a plurality of red filter patterns R, a plurality of green filter patterns G, and a plurality of blue filter patterns B.

Usually, a gate metal layer and a source/drain metal layer can be disposed on the array substrate. The first metal layer in this embodiment can be the gate metal layer or source/drain metal layer. Correspondingly, the first metal structure 01a can be any metal structure comprised in the gate metal layer or the source/drain metal layer, and a part of a surface of this metal structure need to be exposed and may be seriously oxidized and cause a poor contact after the organic insulating layer 40 is formed.

Figure 6A:
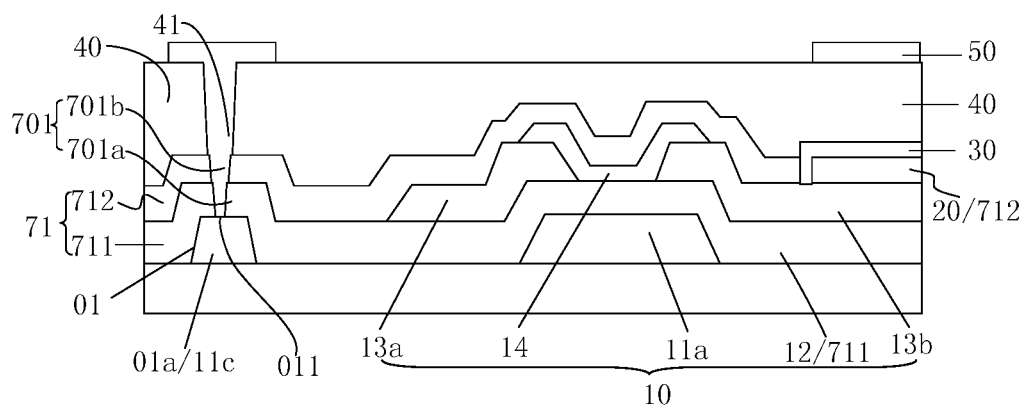
FIG. 6a is a schematic view of a part of an array substrate that can be fabricated by using a method according to an embodiment of the present disclosure.

For example, as illustrated in FIG. 5 and FIG. 6a, the first metal layer 01 can be the gate metal layer. The first metal layer 01 may comprise a gate electrode 11a, a common electrode line 11c, and a gate line 11b connected with the gate electrode 11a; the first metal structure 01a may comprise the common electrode line 11c or the gate line 11b. Alternatively, the first metal layer 01 may comprise a gate electrode 11a and a gate line 11b connected with the gate electrode 11a; the first metal structure 01a may comprise the gate line 11b. In FIG. 6a, the first metal structure 01a is the common electrode 11c, which is taken as an example for illustration below.

Figure 6B:
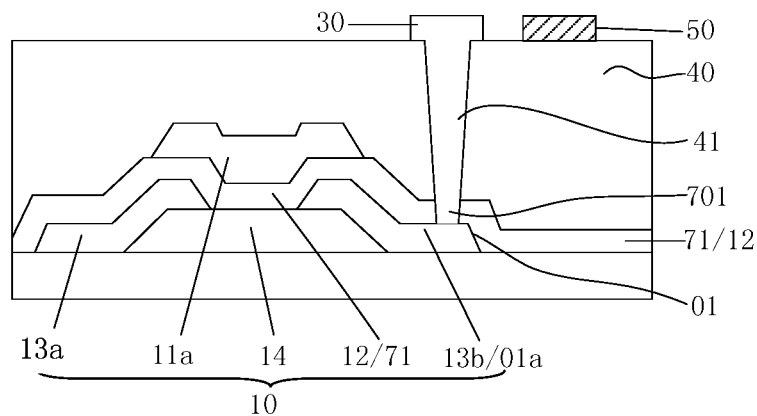
FIG. 6b is a schematic view of a part of an array substrate that can be fabricated by using a method according to an embodiment of the present disclosure.

Or, for example, as illustrated in FIG. 5 and FIG. 6b, the first metal layer 01 can be a source/drain metal layer. The first metal layer 01 may comprise a source electrode 13a, a drain electrode 13b, and a data line 13c connected with the source electrode 13a. The first metal structure 01a may comprise either of the source electrode 13a and the drain electrode 13b, or may comprise the data line 13c. In FIG. 6b, the first metal structure 01a is the drain electrode 13b, which is taken as an example for illustration below.

In FIG. 6a, the thin film transistor 10 is provided in a bottom gate bottom contact structure, i.e., the gate electrode 11a is disposed under the active layer 14, and the source electrode 13a and the drain electrode 13b contact with the bottom surface of the active layer 14. In FIG. 6b, the thin film transistor 10 is provided with a top gate top contact structure, i.e., the gate electrode 11a is disposed on the active layer 14, and the source electrode 13a and the drain electrode 13b are contacted with the top surface of the active layer 14.

It should be noted that, the type of the thin film transistor 10 is not limited in this embodiment, that is, the position relationship between the active layer 14 and the gate electrode 11a in the thin film transistor 10 is not limited, and the position relationship between the active layer 14 and the source electrode 13a/the drain electrode 13b is not limited. In addition, the connection relationship between the active layer 14 and the source electrode 13a/drain electrode 13b is not limited in this embodiment. For example, an insulating layer can be disposed between the active layer 14 and the source electrode 13a/or the drain electrode 13b, and in this way, the active layer 14 and the source electrode 13a/or the drain electrode 13b are connected through a via hole; or, for example, the active layer 14 and the source electrode 13a/the drain electrode 13b can be connected through a conductive structure.

The preparation method according to this embodiment is suitable for the array substrate further comprising a common electrode, i.e., the preparation method may further comprise: forming a common electrode 50. The common electrode 50 are disposed on the organic insulating layer 40, the common electrode 50 and the common electrode line 11c are electrically connected, as illustrated in FIG. 6a.

Further, the preparation method according to this embodiment further comprises: forming a pixel electrode 30 when the common electrode 50 is formed, or before or after the common electrode 50 is formed, to connect the pixel electrode 30 with the drain electrode 13b, as illustrated in FIG. 6b.

In FIG. 6a, the pixel electrode 30 is disposed under the common electrode 50. Therefore, the pixel electrode 30 is formed before the common electrode 50 is formed. In FIG. 6b, the common electrode 50 and the pixel electrode 30 are disposed in a same layer. Therefore, the common electrode 50 and the pixel electrode 30 can be formed in a same process.

In the preparation method of the array substrate according to this embodiment, the first insulating layer 71 comprises an insulating layer. For example, the first insulating layer 71 comprises a gate insulating layer 12, and the gate insulating layer 12 contacts with the gate electrode 11a and is disposed between the gate electrode 11a and the active layer 14. As illustrated in FIG. 6b, the first insulating layer 71 comprises a gate insulating layer 12, and The first via hole 701 is in the gate insulating layer 12. Or, the first insulating layer 71 comprises a passivation layer covering the thin film transistor.

Or, the first insulating layer 71 comprises a plurality of insulating layers. For example, as illustrated in FIG. 6a, the first insulating layer 71 comprises two insulating layers that are a first sub-insulating layer 711 (for example, a gate insulating layer 12) and a second sub-insulating layer 712 (for example, a passivation layer 20), and the second sub-insulating layer 712 is formed on the first sub-insulating layer 711; the first via hole 701 comprises a first sub via hole 701a in the first sub-insulating layer 711 and a second sub via hole 701b in the second sub-insulating layer 712, and the first sub via hole 701a and the second sub via hole 701b are communicated with each other. In FIG. 6a, the first metal structure 01a is the common electrode line 11c, the first sub-insulating layer 711 is the gate insulating layer 12, and the second sub-insulating layer 712 is the passivation layer 20, which configuration is taken as an example for illustration. Embodiments of the present disclosure comprise but are not limited to this configuration.

Figure 7A:
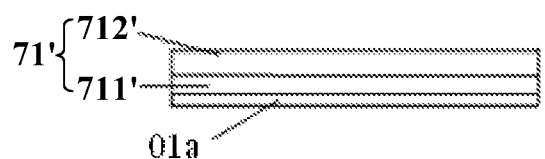
FIG. 7a to FIG. 7c are schematic views of an array substrate that is fabricated by using a method according to an embodiment of the present disclosure in the steps of fabricating a first metal layer, a first sub-insulating layer, a second sub-insulating layer and an organic insulating layer.
Figure 7B:
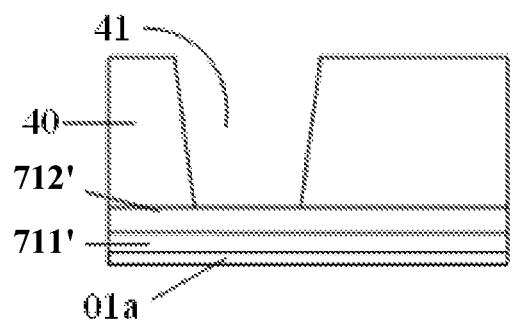
Figure 7C:
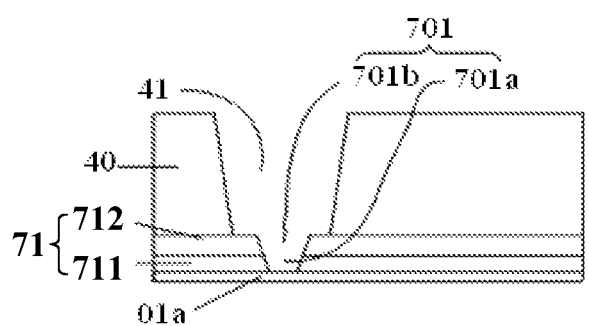

In the case that the first insulating layer 71 comprises the first sub-insulating layer 711 and the second sub-insulating layer 712, the preparation method of the first insulating layer 71, for instance, comprises: as illustrated in FIG. 7a, forming a first sub-insulating film 711' and a second sub-insulating film 712' on the first sub-insulating film 711' to form a first insulating film 71'; then, forming an organic insulating layer 40 on the second sub-insulating film 712' and a first organic insulating layer via hole 41, as illustrated in FIG. 7b; after the organic insulating layer 40 is formed, removing part of the material of the first sub-insulating film 711' and part of the material of the second sub-insulating film 712' to expose part of the surface of the first metal structure 01a and form a first sub via hole 701a, a second sub via hole 701b, a first sub-insulating layer 711, and a second sub-insulating layer 712. The first insulating layer 71 comprises the first sub-insulating layer 711 and the second sub-insulating layer 712. The first via hole 701 comprises the first sub via hole 701a and the second sub via hole 701b, as illustrated in FIG. 7c.

Figure 8A:
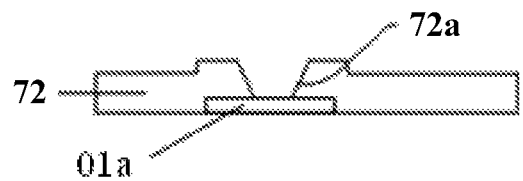
FIG. 8a to FIG. 8d are schematic views of an array substrate that is fabricated by using a method according to an embodiment of the present disclosure in the steps of fabricating a first metal layer, a second insulating layer, a first insulating layer and an organic insulating layer.
Figure 8B:
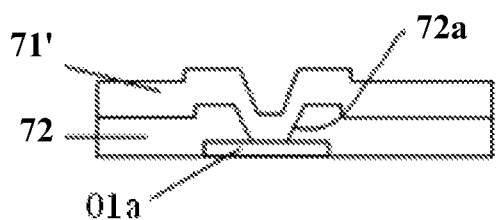
Figure 8C:
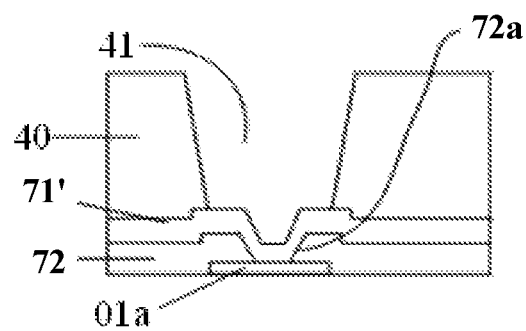
Figure 8D:
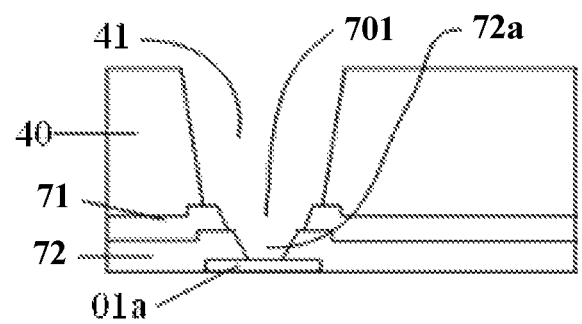

In at least one example, a second insulating layer is formed between the first insulating layer 71 and the organic insulating layer 40. In this configuration, for example, the preparation method comprises: as illustrated in FIG. 8a, forming a second insulating layer 72 on the first metal layer and a via hole 72a in the second insulating layer 72, wherein the via hole 72a in the second insulating layer 72 corresponds to part of the surface of the first metal structure 01a; then, as illustrated in FIG. 8b, forming a first insulating film 71' on the second insulating layer 72, wherein the material of the first insulating film 71' covers the via hole 72a in the second insulating layer 72; then, forming an organic insulating layer 40 on the first insulating film 71' and a first organic insulating layer via hole 41, wherein the first organic insulating layer via hole 41 corresponds to the via hole 72a in the second insulating layer 72, as illustrated in FIG. 8c; after the organic insulating layer 40 is formed, removing the part of the first insulating film 71' covering the via hole 72a in the second insulating layer 72 to expose the part of the surface of the first metal structure 01a and thus form the first via hole 701 and the first insulating layer 71, as illustrated in FIG. 8d.

Figure 9A:
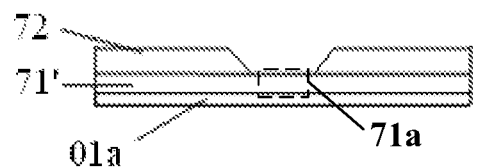
FIG. 9a to FIG. 9c are schematic views of an array substrate that is fabricated by using a method according to an embodiment of the present disclosure in the steps of fabricating a first metal layer, a first insulating layer, a second insulating layer and an organic insulating layer.
Figure 9B:
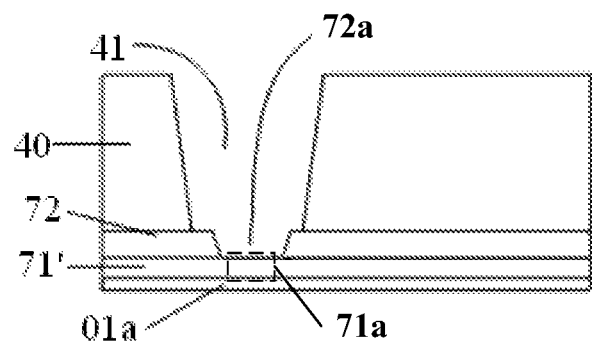
Figure 9C:
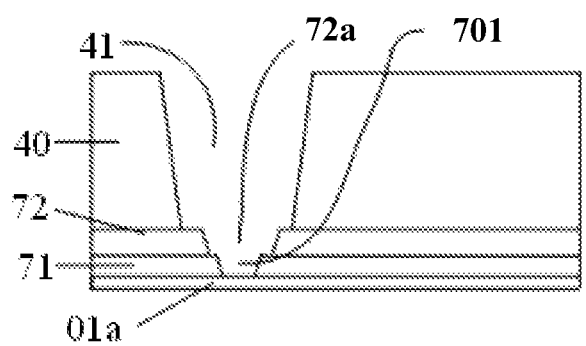

Or, in at least one example, a second insulating layer can be further formed between the first insulating layer 71 and the first metal layer 01. In this configuration, for example, the preparation method comprises: forming a second insulating layer 72 on the first insulating film 71' and a via hole 72a in the second insulating layer 72, wherein the via hole 72a in the second insulating layer 72 corresponds to the first part 71a in the first insulating film 71', as illustrated in FIG. 9a; then, forming an organic insulating layer 40 on the second insulating layer 72 and a first organic insulating layer via hole 41, wherein the first organic insulating layer via hole 41 corresponds to the via hole 72a in the second insulating layer 72, as illustrated in FIG. 9b; after the organic insulating layer 40 is formed, removing the first part 71a of the first insulating film 71' corresponding to the first metal structure 01a to expose the part of the surface of the first metal structure 01a and thus form the first insulating layer 71 and the first via hole 701, as illustrated in FIG. 9c.

Second Embodiment

In the preparation method of the array substrate according to an embodiment of the present disclosure, a second metal layer comprising a second metal structure is further formed before the non-metallic film is formed; when the non-metallic film is formed, it comprises a second part corresponding to the second metal structure; when the organic insulating layer is formed, a second organic insulating layer via hole corresponding to the second part of the non-metallic film is formed; when the first part of the non-metallic film is removed, the second part is also removed to exposing part of the surface of the second metal structure; in this way, the metal layers on the array substrate can be protected, to avoid the poor contact of the metal structure and other components caused by the metal structure in the metal layers that is seriously oxidized after the organic insulating layer is formed.

Below an example is taken for illustration in which the non-metallic film comprises the first insulating film and the second part of the non-metallic film is the second part of the first insulating film.

Figure 10:
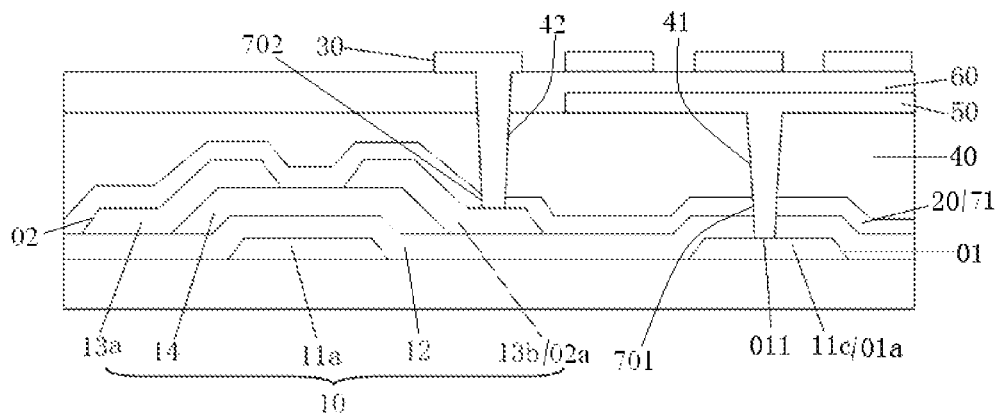
FIG. 10 is a schematic view of a part of an array substrate that can be fabricated by using a method according to an embodiment of the present disclosure.
Figure 11A:
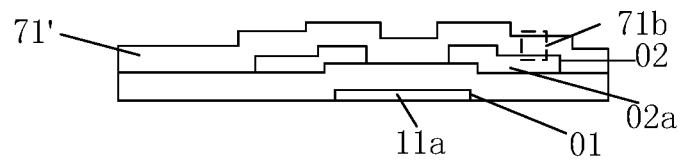
FIG. 11a to FIG. 11c are schematic views of an array substrate that is fabricated by using a method according to an embodiment of the present disclosure in the steps of fabricating a second metal layer, a first insulating layer and an organic insulating layer.
Figure 11B:
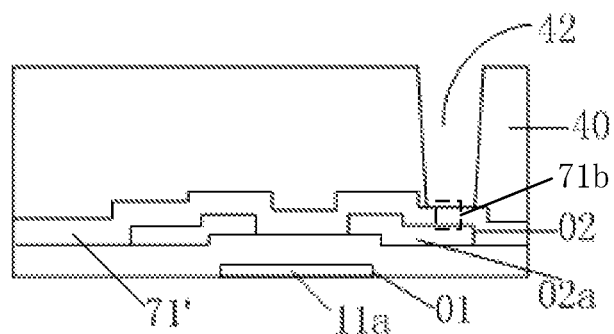
Figure 11C:
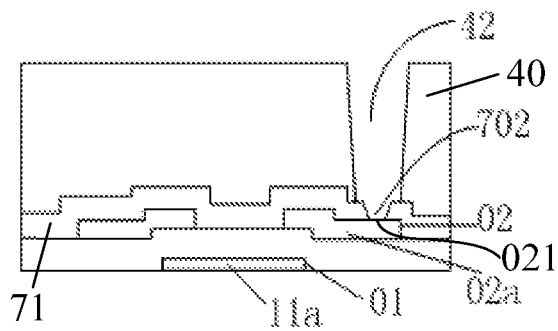

For example, based on the first embodiment, as illustrated in FIG. 10 to FIG. 11c, the preparation method according to this embodiment further comprises: before the first insulating film 71' is formed, forming a second metal layer 02 (for example, a source/drain metal layer), wherein an insulating layer is formed between the second metal layer 02 and the first metal layer 01, and the second metal layer comprises a second metal structure 02a; when the first insulating film 71' is formed, allowing the first insulating film 71' to further comprise a second part 71b corresponding to the second metal structure 02a; when the organic insulating layer 40 is formed, also forming a second organic insulating layer via hole 42 in the organic insulating layer 40, wherein the second organic insulating layer via hole 42 corresponds to the second part 71b of the first insulating film 71'; when the first insulating layer 71 is formed, also forming a second via hole 702 in the first insulating layer 71, wherein the second via hole 702 corresponds to the second organic insulating layer via hole 42 and exposes the part of the surface 021 of the second metal structure 02a.

This embodiment is suitable for the second metal structure that is made from copper or a copper alloy. That is, the second metal structure 02a is made from a material comprising copper or a copper alloy. Because compared with other metal materials such as aluminium or molybdenum, copper is more prone to be seriously oxidized at a high temperature, and it is more easy to cause the poor contact of the second metal structure with other components. Of course, the second metal structure 02a not only can be made from copper or a copper alloy, but also can be made from another metal that may be seriously oxidized to cause the poor contact at the location after the organic insulating layer 40 is formed.

In the preparation method according to this embodiment, one of the first metal layer 01 and the second metal layer 02 can be the gate metal layer, and the other one can be the source/drain metal layer.

For example, as illustrated in FIG. 5 and FIG. 10, the first metal layer 01 comprises a gate electrode 11a, a common electrode line 11c, and a gate line 11b connected with the gate electrode 11a. The first metal structure 01a comprises the common electrode line 11c or a gate line 11b. The second metal layer 02 comprises a source electrode 13a, a drain electrode 13b, and a data line 13c connected with the source electrode 13a. The second metal structure 02a comprises any one of the source electrode 13a and the drain electrode 13b or the data line 13c.

Or, for example, the first metal layer 01 comprises a gate electrode 11a and a gate line 11b connected with the gate electrode 11a. The first metal structure 01a comprises the gate line 11b. The second metal layer 02 comprises a source electrode 13a, a drain electrode 13b, and a data line 13c connected with the source electrode 13a. The second metal structure 02a comprises any one of the source electrode 13a and the drain electrode 13b or the data line 13c.

Or, for example, the first metal layer 01 comprises a source electrode 13a, a drain electrode 13b, and a data line 13c connected with the source electrode 13a. The first metal structure 01a comprises any one of the source electrode 13a and the drain electrode 13b or the data line 13c. The second metal layer 02 comprises a gate electrode 11a, a common electrode line 11c, and the gate line 11b connected with the gate electrode 11a. The second metal structure 02a comprises the common electrode line 11c or the gate line 11b.

Or, for example, the first metal layer 01 comprises a source electrode 13a, a drain electrode 13b, and a data line 13c connected with the source electrode 13a. The first metal structure 01a comprises any one of the source electrode 13a and the drain electrode 13b or the data line 13c. The second metal layer 02 comprises a gate electrode 11a and a gate line 11b connected with the gate electrode 11a. The second metal structure 02a comprises the gate line 11b.

In FIG. 11a to FIG. 11c, the first metal layer 01 is the gate metal layer and the second metal layer 02 is the source/drain metal layer, which configuration is taken as an example for illustration.

Third Embodiment

In the preparation method of an array substrate according to this embodiment, the non-metallic film mentioned above further comprises an active layer pattern. The material of the first part mentioned above comprises a material that the active layer is made from. In this embodiment, the material for forming the active layer in the thin film transistor protects the first metal structure, which can avoid the poor contact between the first metal structure and other component caused by the first metal structure that is seriously oxidized after the organic insulating layer is formed.

The preparation method of an array substrate according to this embodiment is described as follows in connection with the accompanying drawings. As illustrated in FIG. 12a to FIG. 12e, the preparation method comprises the following steps S41 to S44, which will be described in detail as follows.

Figure 12A:
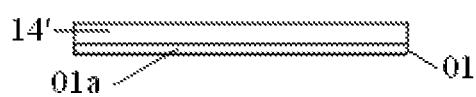
FIG. 12a to FIG. 12e are schematic views of an array substrate that is fabricated by using a method according to an embodiment of the present disclosure in the steps of fabricating a first metal layer, an active layer and an organic insulating layer.

Step S41: forming a first metal layer 01 comprising a first metal structure 01a, as illustrated in FIG. 12a.

The first metal layer 01 can be formed in a conventional patterning process in the related art, which is not repeated herein. Only the first metal structure 01a comprised in the first metal layer 01 is illustrated in FIG. 12a, while the rest metal structure in the first metal layer 01 is not illustrated in FIG. 12a.

Figure 12B:
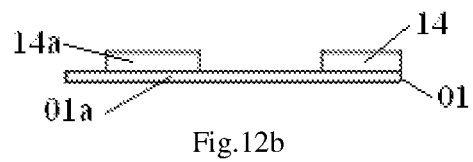

Step S42: forming an active film 14' on the first metal layer 01, as illustrated in FIG. 12a; patterning the active film 14' to form an active layer pattern 14 and a first part 14a (a reserved part of the active film 14') corresponding to the first metal structure 01a, wherein the first part 14a is disposed on the first metal structure 01a, as illustrated in FIG. 12b.

Figure 12C:
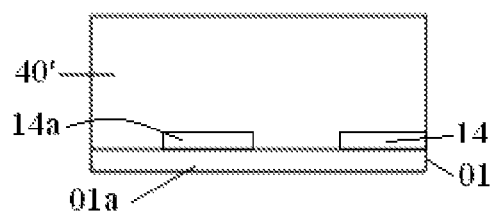

In FIG. 12c, the active layer pattern 14 and the first part 14a both contact with the first metal structure 01a, and this configuration is taken as an example for illustration. In this configuration, for example, the first metal structure 01a can be the drain electrode of the thin film transistor. Of course, the active layer pattern 14 also can be disposed on the first metal structure 01a and does not contact with the first metal structure 01a.

Figure 12D:
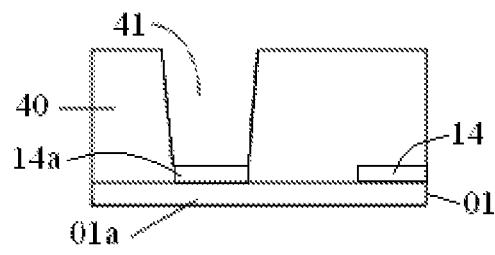

Step S43: forming an organic insulating film 40' on the active layer pattern 14 and the first part 14a, as illustrated in FIG. 12c; patterning the organic insulating film 40' to form a first organic insulating layer via hole 41; then, baking the organic insulating film 40' that has been patterned to form an organic insulating layer 40, wherein the first organic insulating layer via hole 41 is disposed in the organic insulating layer 40 and corresponds to the first part 14a, as illustrated in FIG. 12d.

For example, the baking temperature is greater than or equal to 200° C. It should be noted that, this baking temperature range is a conventional temperature range in the related art, only to illustrate the baking process and not limitative to the scope of the embodiment.

Figure 12E:
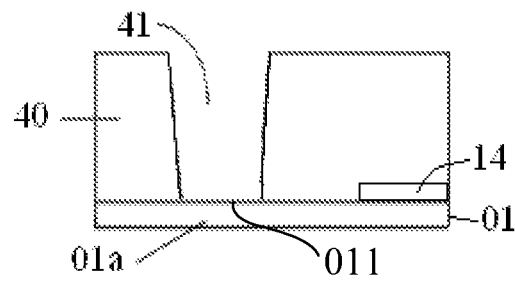
Figure 13:
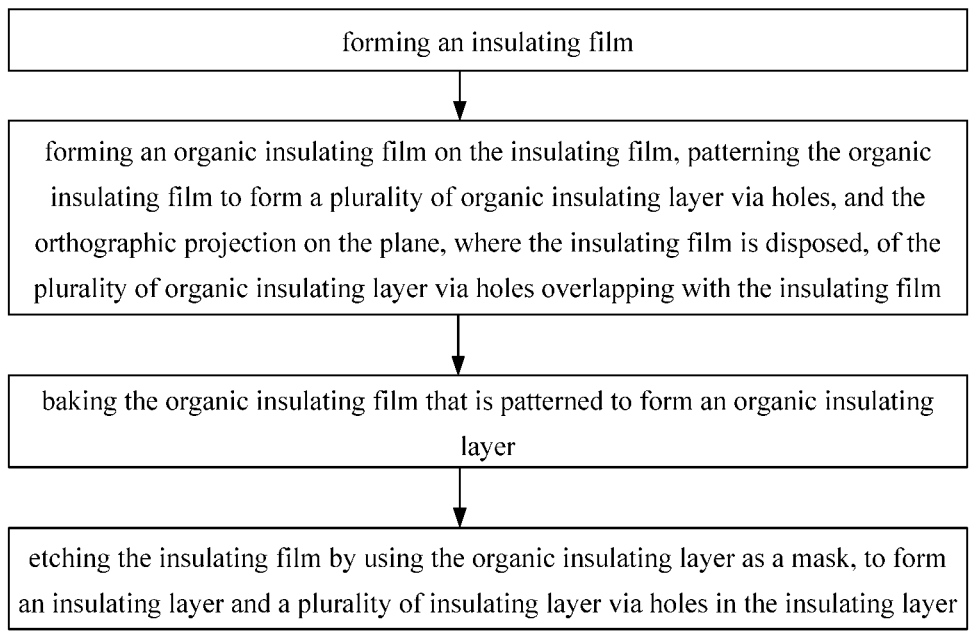
FIG. 13 is a flow chart of another method of fabricating an array substrate according to an embodiment of the present disclosure.

Step S44: removing the first part 14a of the active film 14' to expose the part of the surface 011 of the first metal structure 01a, as illustrated in FIG. 12e.

In this step, after the organic insulating layer is formed, the material (that is the first part 14a) forming the active layer pattern and covering the part of the metal structure is removed. Because the active layer pattern is made from a semiconducting material, and the electrical resistivity of the semiconducting material is larger than that of a metal, removing of the semiconducting material covering the first metal structure can avoid the resistance between the first metal structure and other component from increasing.

Compared with a conventional preparation method of an array substrate (for example, the preparation method of the array substrate as illustrated in FIG. 1), the preparation method according to the first embodiment, and the preparation method according to the second embodiment, only the step S44 mentioned above is added to the preparation method according to this embodiment, which step can avoid the poor contact between the first metal structure and other component caused by the first metal structure that is seriously oxidized. Compared with the method in which the organic insulating layer is fabricated in an inert gas or the method in which the surface of the metal structure is deoxidized after the organic insulating layer is formed, the cost of the preparation method according to this embodiment is lowered.

The preparation method according to this embodiment also can be used to protect a plurality of metal layers, as long as the active film comprises parts corresponding to the metal layers when an active film is formed, corresponding organic insulating layer via holes are formed when an organic insulating layer is formed, the parts corresponding to the metal layers is removed after the organic insulating layer is formed. The detail description can be referred to the second embodiment, which is not repeated herein.

Fourth Embodiment

The preparation method of an array substrate according to this embodiment, as illustrated in FIG. 13 and FIG. 14a to FIG. 14c, comprises the following steps S41 to S43, which will be described in detail as follows.

Figure 14A:
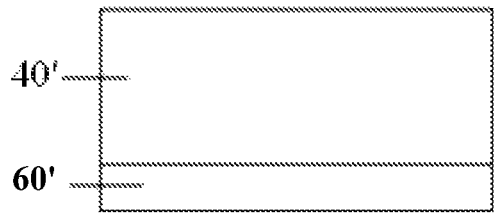
FIG. 14a to FIG. 14c are schematic views of an array substrate that is fabricated by using a method according to an embodiment of the present disclosure in the steps of fabricating an insulating layer and an organic insulating layer.

Step S41: as illustrated in FIG. 14a, forming an insulating film 60'.

Figure 14B:
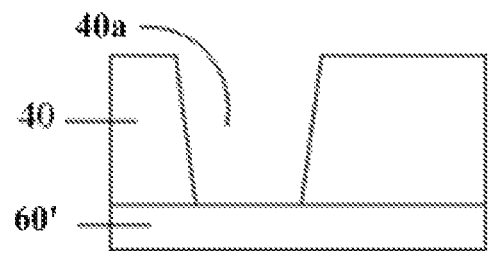

Step S42: forming an organic insulating film 40' on the insulating film 60', as illustrated in FIG. 14a; patterning the organic insulating film 40' to form a plurality of organic insulating layer via holes 40a, wherein the orthographic projection, on the plane where the insulating film 60' is disposed, of the plurality of organic insulating layer via holes 40a overlaps with the insulating film 60'; then, baking the organic insulating film 40' that has been patterned to form an organic insulating layer 40, as illustrated in FIG. 14b.

For example, the baking temperature is greater than or equal to 200° C. It should be noted that, this baking temperature range is a conventional temperature range in the related art, only to illustrate the baking process and not limitative to the scope of the embodiment.

It should be noted that, the patterning process in this embodiment can be any process that can process a film to form a predetermined pattern. For example, it can be a process that forms a predetermined pattern by using a mask.

Figure 14C:
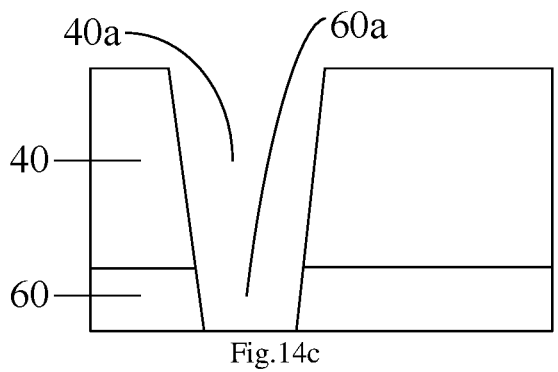

Step S43: etching the insulating film 60' with the organic insulating layer 40 as a mask, to form an insulating layer 60 and a plurality of insulating layer via holes 60a in the insulating layer 60, as illustrated in FIG. 14c.

For example, the insulating layer 60 comprises a gate insulating layer and/or a passivation layer. The gate insulating layer contacts with the gate electrode of the thin film transistor in the array substrate and is disposed between the gate electrode and the active layer of the thin film transistor, and the passivation layer covers the thin film transistor.

In this embodiment, using the organic insulating layer 40 as a mask may cause a slight deformation to the organic insulating layer 40. Therefore, after the first insulating layer 71 and the first via hole 701 are formed, the organic insulating layer 40 can be, for instance, ashed.

Fifth Embodiment

This embodiment provides a preparation method of a display device comprising an array substrate. The preparation method comprises: fabricating the array substrate by using the preparation method according to any one of the above embodiments.

For example, the preparation method of the display device according to this embodiment can be used to fabricate a liquid crystal display device.

For example, the liquid crystal display device comprises an array substrate and an opposite substrate (for example, a color filter substrate). The array substrate and the opposite substrate are disposed opposite to each other and are sealed by sealant to form a liquid crystal cell in which a liquid crystal material is filled. The pixel electrode comprised in each array substrate is used for applying an electric field to control the rotation degree of the liquid crystal material and thus to conduct display operation.

Correspondingly, the preparation method of the display device can further comprise steps such as forming the opposite substrate, cell-assembling the array substrate and the opposite substrate, and so on. These steps can be realized by using conventional methods in the related art, which is not repeated in this embodiment.

Sixth Embodiment

This embodiment provides a preparation method of a conductive via hole structure. The conductive via hole structure comprises a metal layer comprising a metal structure, a non-metallic layer disposed on the metal layer, and an organic insulating layer disposed on the non-metallic layer. In the preparation method, before the organic insulating layer is formed, the metal structure is covered by the non-metallic layer. After the organic insulating layer is formed, a part of the non-metallic layer covering a part of the surface of the metal structure is removed. With this method, in the premise of minimizing cost, the metal structure in the conductive via hole structure can be protected from being seriously oxidized after the organic insulating layer is formed.

Figure 15:
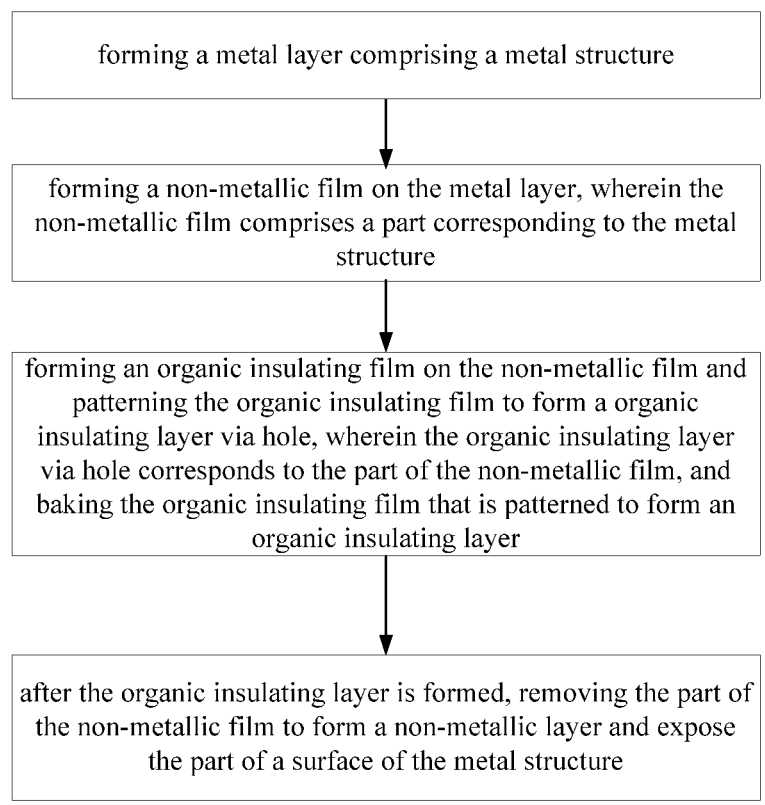
FIG. 15 is a flow chart of a method of fabricating a conductive via hole structure according to an embodiment of the present disclosure.

As illustrated in FIG. 15, the method comprises the following steps S61 to S64, will be described in detail as follows.

Step S61: forming a metal layer comprising a metal structure. For example, the metal structure is made from a material comprising copper or a copper alloy.

Step S62: forming a non-metallic film on the metal layer, wherein the non-metallic film comprises a part corresponding to the metal structure mentioned above. For example, the non-metallic film is made from a material comprising an insulation material or a semiconductor material.

Step S63: forming an organic insulating film on the non-metallic film; patterning the organic insulating film to form an organic insulating layer via hole corresponding to the part of the non-metallic film mentioned above; and baking the organic insulating film that has been patterned to form an organic insulating layer.

Step S64: after the organic insulating layer is formed, removing the part of the non-metallic film mentioned above to form a non-metallic layer and expose the part of the surface of the metal structure.

The preparation method of the conductive via hole structure according to this embodiment is suitable for a conductive via hole structure in any electronic device. As long as the conductive via hole structure is provided with a metal layer, a non-metallic layer disposed on the metal layer, and an organic insulating layer disposed on the non-metallic layer. For example, the conductive via hole structure can be provided on an array substrate, and it also can be provided in other electronic device.

The preparation method of the conductive via hole structure according to this embodiment can be referred to the related description in the first embodiment to the third embodiment mentioned above, which is not repeated herein.

What are described above is related to the illustrative embodiments of the disclosure only and not limitative to the scope of the disclosure. Therefore, the scopes of the disclosure are defined by the accompanying claims.

The present application claims the priority of the Chinese Patent Application No. 201510415374.4 filed on Jul. 13, 2015, which is incorporated herein in its entirety by reference as part of the disclosure of the present application.

What is claimed is:

1. A preparation method of an array substrate, comprising:
   forming a first metal layer, wherein the first metal layer comprises a first metal structure;
   forming a second metal layer, wherein the second metal layer comprises a second metal structure;
   forming a non-metallic film, wherein the non-metallic film comprises a first part corresponding to the first metal structure and a second part corresponding to the second metal structure;
   forming an organic insulating film on the non-metallic film and patterning the organic insulating film to form a first organic insulating layer via hole and a second organic insulating layer via hole, wherein the first organic insulating layer via hole corresponds to the first part, and the second organic insulating layer via hole corresponds to the second part;
   baking the organic insulating film that has been patterned to form an organic insulating layer; and
   after the organic insulating layer is formed, removing the first part and the second part of the non-metallic film to form a non-metallic layer and expose a part of a surface of the first metal structure and a second part of a surface of the second metal structure,
   wherein the first metal structure comprises a common electrode line or a gate line, and the second metal structure comprises one of a source electrode, a drain electrode and a data line; or, the first metal structure comprises one of a source electrode, a drain electrode and a data line, and the second metal structure comprises a common electrode line or a gate line.

2. The preparation method according to claim 1, wherein the first metal structure is made from a material comprising copper or a copper alloy.

3. The preparation method according to claim 1, wherein a material of the organic insulating layer comprises a resin.

4. The preparation method according to claim 1, wherein the organic insulating layer is a color filter layer.

5. The preparation method according to claim 1, wherein, forming the non-metallic layer comprises:
   etching the first part of the non-metallic film with the organic insulating layer as a mask.

6. The preparation method according to claim 1, wherein, forming the non-metallic film comprises: forming a first insulating film,
   forming the non-metallic layer comprises forming a first insulating layer and a first via hole in the first insulating layer, and the first via hole exposes the part of the surface of the first metal structure.

7. The preparation method according to claim 6, further comprising: forming a second insulating layer and a via hole in the second insulating layer, wherein,
   the second insulating layer and the via hole in the second insulating layer are formed on the first metal layer, the via hole in the second insulating layer corresponds to the part surface of the first metal structure; the first insulating film is formed on the second insulating layer, the first insulating film covers the via hole in the second insulating layer; the organic insulating layer and the first organic insulating layer via hole are formed on the first insulating film, the first organic insulating layer via hole corresponds to the via hole in the second insulating layer; after the organic insulating layer is formed, removing the part of the first insulating layer covering the via hole in the second insulating layer to form the first via hole and the first insulating layer; or
   the second insulating layer and the via hole in the second insulating layer are formed on the first insulating film, the via hole in the second insulating layer corresponds to the first part;
   the first organic insulating layer via hole and the organic insulating layer are formed on the second insulating layer, the first organic insulating layer via hole corresponds to the via hole in the second insulating layer.

8. The preparation method according to claim 6, wherein, forming the first insulating film comprises forming a first sub-insulating film and a second sub-insulating film on the first sub-insulating film;
   after the organic insulating layer is formed, a part of material of the first sub-insulating film and a part of material of the second sub-insulating film are removed to form a first sub-insulating layer, a second sub-insulating layer, a first sub via hole in the first sub-insulating layer, and a second sub via hole in the second sub-insulating layer, the first insulating layer comprises the first sub-insulating layer and the second sub-insulating layer, and the first via hole comprises the first sub via hole and the second sub via hole.

9. The preparation method according to claim 6, wherein,
the array substrate comprises a thin film transistor, and the thin film transistor comprises a gate substrate and an active layer; and
the first insulating layer comprises a gate insulating layer, and the gate insulating layer contacts with the gate electrode and is disposed between the gate electrode and the active layer;
and/or the first insulating layer comprises a passivation layer, and the passivation layer covers the thin film transistor.

10. The preparation method according to claim 1, wherein,
the non-metallic film further comprises an active layer pattern, and a material of the first part comprises a material that the active layer is made from.

11. The preparation method according to claim 1, wherein, a material of the second metal structure comprises copper or a copper alloy.

12. The preparation method according to claim 1, wherein, a thickness of the organic insulating layer is in a range of 10000 angstrom to 40000 angstrom.

13. A preparation method of a display device comprising an array substrate, comprising: preparing an array substrate by using the preparation method according to claim 1.

* * * * *